United States Patent
Schuster

(10) Patent No.: US 6,597,498 B1
(45) Date of Patent: Jul. 22, 2003

(54) OPTICAL SYSTEM FOR THE VACUUM ULTRAVIOLET

(75) Inventor: Karl-Heinz Schuster, Königsbronn (DE)

(73) Assignee: Carl-Zeiss-Stiftung, Heidenheim-Brenz (DE)

( * ) Notice: Subject to any disclaimer, the term of this patent is extended or adjusted under 35 U.S.C. 154(b) by 344 days.

(21) Appl. No.: 09/612,359

(22) Filed: Jul. 7, 2000

(30) Foreign Application Priority Data

Jul. 9, 1999 (DE) .......................................... 199 31 947

(51) Int. Cl.[7] .......................... G02B 13/14; G02B 5/30; G02B 27/28
(52) U.S. Cl. ..................... 359/350; 359/355; 359/352; 359/494; 359/495; 359/497; 359/500
(58) Field of Search .......................... 250/492.2, 54 R, 250/492.1, 493.1; 313/35, 39; 359/350, 355, 351, 352, 494, 495, 497

(56) References Cited

U.S. PATENT DOCUMENTS

| | | | | |
|---|---|---|---|---|
| 4,660,472 A | * | 4/1987 | Stevens | 102/202.1 |
| 5,867,315 A | * | 2/1999 | Koike et al. | 359/495 |
| 5,908,482 A | * | 6/1999 | Komine et al. | 65/111 |
| 6,014,256 A | * | 1/2000 | Cheng | 359/494 |
| 6,038,079 A | * | 3/2000 | Michaels | 359/656 |
| 6,043,940 A | * | 3/2000 | Kamiyama et al. | 359/245 |
| 6,198,793 B1 | | 3/2001 | Schultz et al. | |
| 6,345,065 B1 | * | 2/2002 | Kleinschmidt et al. | 372/100 |

FOREIGN PATENT DOCUMENTS

EP   0 779 528   6/1997

OTHER PUBLICATIONS

U.S. patent application Ser. No. 60/094,579, filed Jul. 1998.
U.S. patent application Ser. No. 09/451,505, filed Nov. 1999.
"Anomalous Dispersion of Birefringence of Sapphire and Magnesium Fluoride in the Vacuum Ultraviolet" by V. Chandrasekharan et al, Applied Optics, Mar. 1969, vol. 8, No. 3, pp. 671 to 675.

* cited by examiner

Primary Examiner—John R. Lee
Assistant Examiner—Mary El-Shammaa
(74) Attorney, Agent, or Firm—Walter Ottesen

(57) ABSTRACT

The invention is directed to an optical system for the vacuum ultraviolet range wherein the optical system utilizes the isotropic point at which the wavelength of the double refraction of a crystal is eliminated. The crystal is preferably of $MgF_2$. With the optical system, a known good optical material, namely, $MgF_2$, which is limited only by its double refraction, becomes usable for the VUV optics.

8 Claims, 2 Drawing Sheets

OPTICAL SYSTEM FOR THE VACUUM ULTRAVIOLET

FIELD OF THE INVENTION

The invention relates to an optical system having a light source and an objective having a lens of crystal.

BACKGROUND OF THE INVENTION

Systems of the above kind have long been known as UV optical systems with calcium fluoride lenses as well as with barium fluoride lenses. These systems are also configured as microlithographic projection exposure systems having the highest requirements. Especially important wavelengths below 200 nm to the vicinity of 100 nm (that is, in the VUV range) become accessible via various fluorides. Examples of the above are provided in U.S. patent application Ser. No. 09/451,505, filed Nov. 30, 1999, (corresponding to German patent application DE 199 29 701.0) which is incorporated herein by reference.

Magnesium fluoride can be produced in large pieces and can be well processed with optical quality and combines high transmission to the lower limit of the above-mentioned range with good radiation resistance. However, magnesium fluoride was up to now not considered as a lens material because of its double refraction, as were all other double-refracting crystals.

VUV-optics and especially microlithographic projection objectives are already configured as catadioptric systems as disclosed, for example, in U.S. Pat. No. 5,815,310. This publication also shows a need for catadioptric systems when a suitable lens material is available as is the case for 193 nm.

SUMMARY OF THE INVENTION

It is an object of the invention to provide alternate configurations of VUV optical systems.

The optical system of the invention includes: a light source for generating light; and, an objective having lenses made of crystal and being mounted downstream of the light source for receiving the light which passes through the objective with an ordinary ray and an extraordinary ray; at least one of the lenses being made of a crystal having a dispersion of double refraction; the dispersion being characterized for the one lens by dispersion curves for the ordinary and extraordinary rays, respectively; the ordinary and extraordinary rays intersecting at an isotropic wavelength; and, the light being generated by the light source at the isotropic wavelength.

Reference is made to an article of V. Chandrasekharan et al entitled "Anomalous Dispersion of Birefringence of Sapphire and Magnesium Fluoride in the Vacuum Ultraviolet" published in Applied Optics, volume 8, No. 3 (March 1969), pages 671 to 675. With this anomalous dispersion of birefringence, the refraction difference vanishes for $MgF_2$ at 119.4 nm and for sapphire at 142.6 nm.

The invention makes use of this rather dated information and provides, for the first time, an imaging optical system wherein the double refraction of the lens material is eliminated by the selection of the light wavelength. In this way, the requirement of the microlithography for optical systems having VUV wavelengths is taken into account.

According to a feature of the invention, a Lyot filter is mounted in the beam path between the light source and the object.

The Lyot filter can be made of the same crystal as the lens. This feature of the invention ensures the suitable filtering of the light.

Optical lithography between 157 nm and 100 nm would be a very economical step for many who work in the area of lithography. The problems below 157 nm are primarily material problems. The main candidates for short wavelengths are presented in Table 1.

TABLE 1

| | Radiation Resistance | Transmission | Size | Processibility |
|---|---|---|---|---|
| LiF | rather poor | good | rather small | good |
| CaF | good | inadequate | large | good |
| $BeF_2$ | average | satisfactory | average | toxic |
| $MgF_2$ | good | good | large | good |

$MgF_2$ is, however, very intensely double refracting. Even small parts of a millimeter in transmission are sufficient, depending upon the orientation and polarization condition, to cause an impermissible wave front split in the image plane.

A very unusual performance results with $MgF_2$, especially when looking at the trace of the double refraction as a function of wavelength. With increasing radiation frequency, the double refraction increases continuously and reaches a maximum at approximately 153 nm. Thereafter, the double refraction drops very sharply and finally reaches negative values (see the above-mentioned article from Applied Optics). According to the invention, the point in the frequency is used at which the material is isotropic. This is the case at 119.49 nm.

The jump from 157 nm to 120 nm would be especially important for a further generation of microlithographic projection exposure systems. The double refraction is a function of the wavelength and the material temperature. For this reason, work ranges must be maintained for the isotropic point. The operation with the temperature is more likely easier to adjust because of the excellent thermal conductivity of $MgF_2$ and the excellent temperature equalization in modern microlithographic projection objectives. More difficulty is experienced with the chromatic bandwidth of the objective made of $MgF_2$. The chromatic bandwidth cannot be achromatized with respect to the double refraction. The dispersion of the double refraction at 119.49 nm is $0.256 \cdot 10^{-6}/pm = \Delta n$. For a numerical aperture of NA=0.80, a $\Delta n$ of approximately $\pm 1.5 \cdot 10^{-7} = \Delta n$ is permitted because this is not a defect which can be focused upon. The stress-induced birefringence caused bandwidth of the system at NA=0.80 lies approximately at 0.5 pm. In this way, the birefringence induced bandwidth is greater than a pure isotropic dispersion bandwidth which one must set at approximately 0.1 nm for a full-field objective having NA=0.80 and $MgF_2$ at 119 nm. With this, the following possibilities are provided by the invention:

1. a purely refractive, noncolor corrected objective with $MgF_2$ at 119.49 nm and 0.1 pm laser bandwidth;
2. a catadioptric objective with $MgF_2$ having a bandwidth of approximately 0.5 pm such as an objective according to Schwarzschild or an h-design, for example, as disclosed in U.S. Pat. No. 6,496,306, incorporated herein by reference;
3. a partly achromatized refractive objective having a bandwidth of approximately 0.5 pm, for example, $BeF_2 + MgF_2$ or $LiF + MgF_2$.
4. $MgF_2$ is, at 119.49 nm, specifically orientated in the crystal direction and is irradiated with light of a special polarization. For example, tangential polarization via the pupil of the objective, E-vector of the MgF$_2$ crystal parallel to the optical axis. In this way, the influence of the double refraction is mitigated for specific lenses close to the pupil and, for a telecentric embodiment, lenses close to the object and close to the image.

Broadband systems are thereby possible with, for example, a 1 to 2 pm bandwidth.

In the configuration of a laser for 119.49 nm, an additional effect can be used which narrows the bandwidth of the laser. Prisms, gratings and etalons function to narrow the bandwidth. It is possible to carry out a periodic extraction with the aid of a Lyot filter from the spectrum of rare gases and their excimer compounds.

Crossed polarizers and an MgF$_2$ rod define the Lyot filter. In the MgF$_2$ rod, the crystal axis is perpendicular to the longitudinal dimension of the rod and is at 45° to the polarization axes. The modulation as a function of frequency assumes a known course but exhibits a distinctiveness at 119.49 nm when the rod is selected correspondingly long. At 119.49 nm, a wider transmissibility is exhibited as a function of frequency.

The temperatures of the objective and of the reference rod have to be coincident or have to be precisely measured and the bandpass range, which is used, has to be determined so that the arrangement works as well as possible. Thereafter, gratings, prisms and etalons can be ideally adjusted in order to adjust the ideal operating mode for the objective having a low phase delay. The Lyot filter can then either be in the active part of the light source or function as a wavelength reference.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
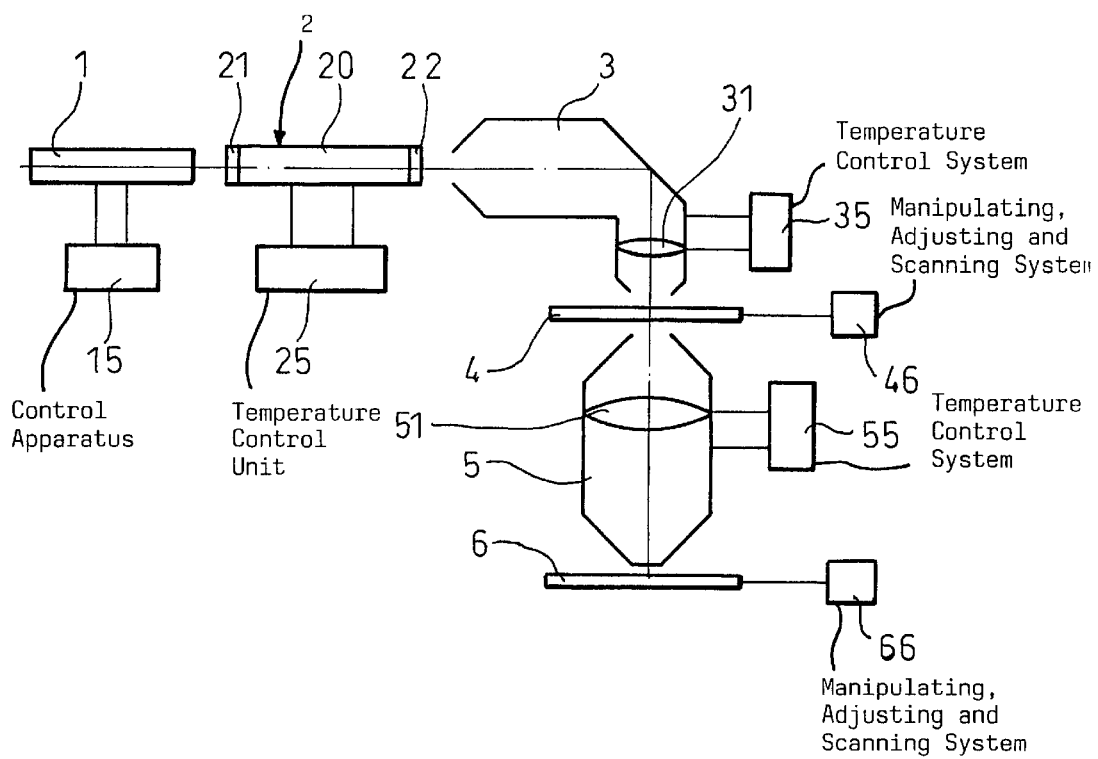
FIG. 1 is a schematic of an optical system according to an embodiment of the invention.

The optical system of FIG. 1 is configured as a projection exposure system for microlithography and has a light source 1, a Lyot filter 2, an illumination optic 3, a mask 4 and a projection objective 5. A wafer is identified by reference numeral 6.

For the laser source 1 having a 119.49 nm central wavelength, no "normal" excimer laser is available; instead, numerous additional lines as well as an electron laser and the continuum radiation (see the above-mentioned article from Applied Optics) are available. A control apparatus 15 also provides for temperature control and ensures tuning or matching and stability of the operation.

The Lyot filter 2 is built up of an MgF$_2$ rod 20 and two crossed polarization filters (21, 22). It is tuned or matched by a temperature control unit 25.

Figure 2:
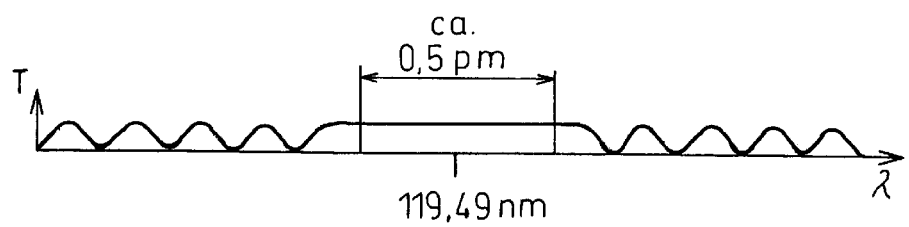
FIG. 2 shows, qualitatively, the filter characteristic line of an MgF$_2$ Lyot filter; and, FIG. 3 is a section view of the lenses of a catadioptric projection objective in accordance with the invention.

FIG. 2 shows qualitatively the transmission trace T as a function of the wavelength λ with a plateau of approximately 0.5 pm width at the wavelength 119.49 nm.

The illumination system 3 is preferably configured in accordance with the particulars given in U.S. Pat. No. 6,198,793 and incorporated herein by reference. Catadioptric embodiments are preferred especially with a lens 31 of MgF$_2$. Here too, a temperature control system 35 functions to precisely adapt the isotropic point of the lens to the illuminating light.

The mask 4 is operated with a known manipulating, adjusting and scanning system 46. The same applies to the object (that is, the wafer 6 to be exposed) with respect to system 66.

The projection objective 5 includes at least a lens 51 of double refracting crystal having an isotropic point, that is, especially MgF$_2$. The objective 5 can be of any known refractive or catadioptric configuration and can also include diffractive elements (zone plates). Catadioptric configurations having few lenses and high aperture are preferred. Here too, a temperature control system 55 serves to provide a precise tuning or matching of the isotropic point.

Figure 3:
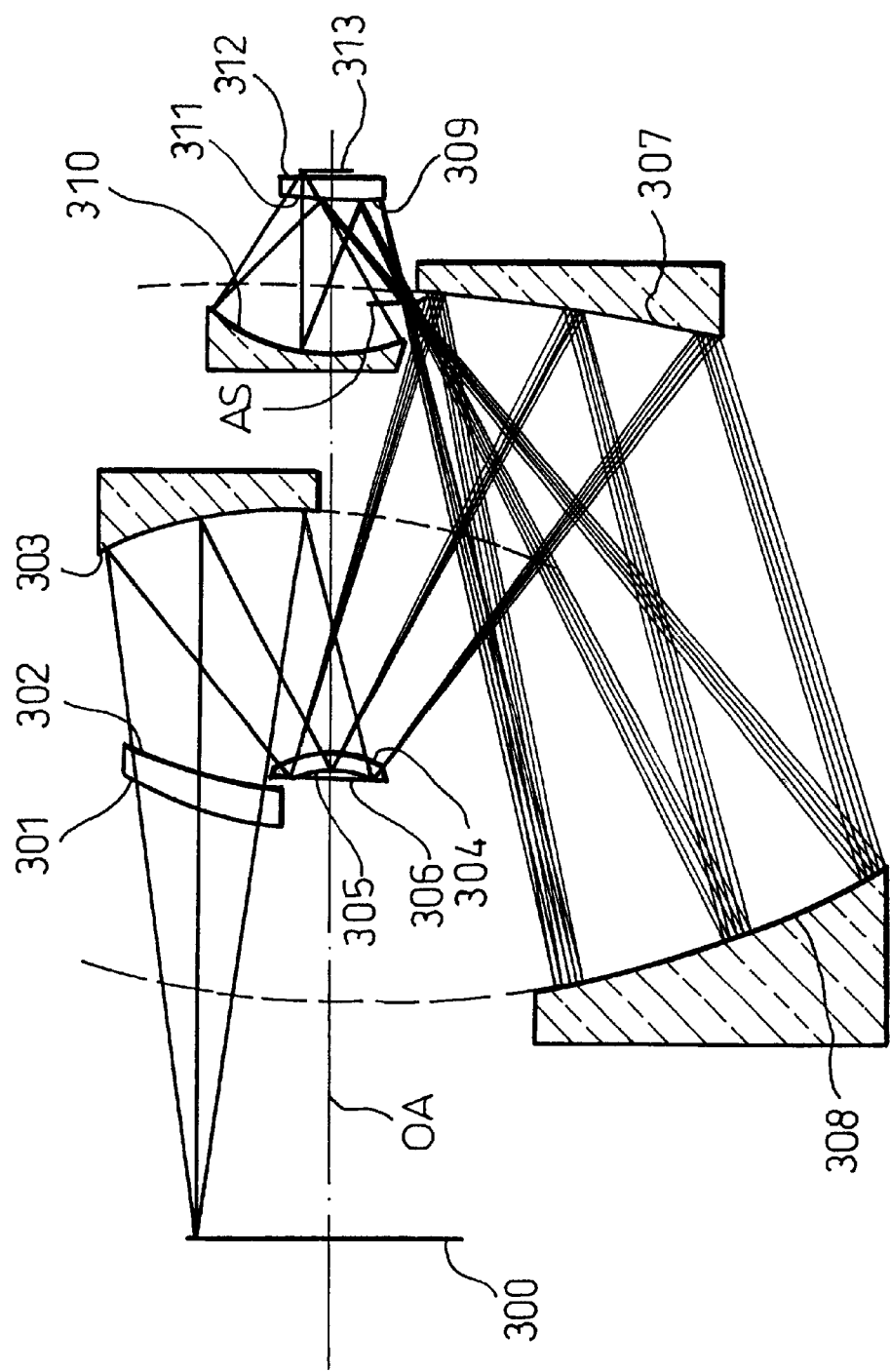

In FIG. 3, an embodiment for the projection objective 5 is shown which is a further development of the catadioptric annular field objective disclosed in U.S. Pat. No. 5,815,310, (corresponding to EP 0 779 528) incorporated herein by reference. By adapting to the specific refraction index, the objectives of the invention can be derived directly from known objectives. Object plane 300, lens surfaces (301, 302), mirror 303, second lens surfaces (305, 304), second mirror 306 and again second lens surfaces (304, 305), third mirror 307, fourth mirror 308, aperture diaphragm AS, fifth mirror 309, sixth mirror 310 and third lens surfaces (311, 312) are passed through to the image plane 313. Referring to FIG. 1, the object plane 300 lies on the mask or reticle 4 and the image plane 313 lies oh the wafer 6.

The suitable orientation of the crystal axes of the MgF$_2$ lenses and the optimal use of polarization effects has already been described above.

According to the invention, an optical system utilizes the isotropic point and the wavelength at which the double refraction of the crystal (preferably MgF$_2$) is eliminated.

In this way, a known good optical material, namely, MgF$_2$, which is only limited by its double refraction, is made available for the VUV optic.

It is understood that the foregoing description is that of the preferred embodiments of the invention and that various changes and modifications may be made thereto without departing from the spirit and scope of the invention as defined in the appended claims.

What is claimed is:

1. An optical system comprising:

a light source for generating light; and, an objective having lenses made of crystal and being mounted downstream of said light source for receiving said light which passes through said objective with an ordinary ray and an extraordinary ray;

at least one of said lenses being made of a crystal having a dispersion of double refraction;

said dispersion being characterized for said one lens by dispersion curves for said ordinary and extraordinary rays, respectively;

said ordinary and extraordinary rays intersecting at an isotropic wavelength; and, said light being generated by said light source at said isotropic wavelength.

2. The optical system of claim 1, wherein said light source emits said light in the vacuum ultraviolet range.

3. The optical system of claim 1, wherein said crystal is made of magnesium fluoride or sapphire.

4. The optical system of claim 1, wherein said objective has a catadioptric configuration.

5. An optical system comprising:

a light source for generating light; and, an objective having lenses made of crystal and being mounted downstream of said light source for receiving said light which passes through said objective with an ordinary ray and an extraordinary ray;

at least one of said lenses being made of a crystal having a dispersion of double refraction;

said dispersion being characterized for said one lens by dispersion curves for said ordinary and extraordinary rays, respectively;

said ordinary and extraordinary rays intersecting at an isotropic wavelength;

said light being generated by said light source at said isotropic wavelength;

said light source and said objective conjointly defining a beam path; and, said system further including a Lyot filter mounted in said beam path between said light source and said objective.

6. The optical system of claim 5, wherein said Lyot filter is made of the same material as said at least one lens.

7. A projection exposure system for microlithography comprising:

a VUV light source emitting light along a beam path;

a plurality of optical elements made of a crystal mounted in said beam path for receiving said light which passes through said optical elements with an ordinary ray and an extraordinary ray;

said crystal having a dispersion characterized by dispersion curves for said ordinary and extraordinary rays; and, said light source being illuminated at a wavelength at which said dispersion curves intersect so that said crystal is not double refracting.

8. The projection exposure system for microlithography of claim 7, wherein said optical elements incorporate an optical system including: an objective having lenses made of said crystal and being mounted downstream of said light source; at least one of said lenses being made of a crystal having a dispersion of double refraction; said dispersion being characterized for said one lens by said dispersion curves for said ordinary and extraordinary rays, respectively; said ordinary and extraordinary rays intersecting at an isotropic wavelength; and, said light being generated by said light source at said isotropic wavelength.

* * * * *